United States Patent
Bleeker

(10) Patent No.: US 6,429,440 B1
(45) Date of Patent: Aug. 6, 2002

(54) LITHOGRAPHY APPARATUS HAVING A DYNAMICALLY VARIABLE ILLUMINATION BEAM

(75) Inventor: Arno Jan Bleeker, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 09/325,411

(22) Filed: Jun. 4, 1999

(30) Foreign Application Priority Data

Jun. 16, 1998 (EP) .............................. 98201997

(51) Int. Cl.[7] .............................. G21G 5/00; A61N 5/00
(52) U.S. Cl. .............................. 250/492.1; 250/492.23; 250/492.3
(58) Field of Search .............................. 250/492, 491, 250/492.21, 492.1, 492.22, 492.23, 492.3

(56) References Cited

U.S. PATENT DOCUMENTS

| | | |
|---|---|---|
| 4,688,932 A | 8/1987 | Suzuki |
| 4,710,640 A | 12/1987 | Kawasaki |
| 5,266,445 A | 11/1993 | Seligson |
| 5,291,240 A * | 3/1994 | Jain ............................ 355/53 |
| 5,313,068 A * | 5/1994 | Meiri et al. ............ 250/492.22 |
| 5,401,972 A * | 3/1995 | Talbot et al. ............. 250/491.1 |
| 5,473,410 A | 12/1995 | Nishi |
| 5,532,496 A * | 7/1996 | Gaston ................... 250/492.22 |
| 6,054,713 A * | 4/2000 | Miyake et al. ......... 250/492.24 |
| 6,204,509 B1 * | 3/2001 | Yahiro et al. ............ 250/492.1 |
| 6,225,637 B1 * | 5/2001 | Terashima et al. ....... 250/492.2 |

FOREIGN PATENT DOCUMENTS

EP     0 838 837 A2     4/1998

OTHER PUBLICATIONS

U.S. application No. 09/340,710, Bleeker, filed Jun. 29, 1999.
U.S. application No. 09/340,711, Bleeker, filed Jun. 29, 1999.
U.S. application No. 09/352,995, Bleeker, filed Jul. 13, 1999.

* cited by examiner

*Primary Examiner*—John R. Lee
*Assistant Examiner*—David Vanore
(74) *Attorney, Agent, or Firm*—Pillsbury Winthrop LLP

(57) ABSTRACT

A lithographic apparatus, e.g. using an electron beam, to expose a radiation sensitive layer on a substrate to the pattern on a mask comprising pattern areas and opaque supports. The apparatus uses a variable shaped beam at the edges of the pattern areas to provide a uniform exposure, while avoiding illumination of the opaque supports.

14 Claims, 6 Drawing Sheets

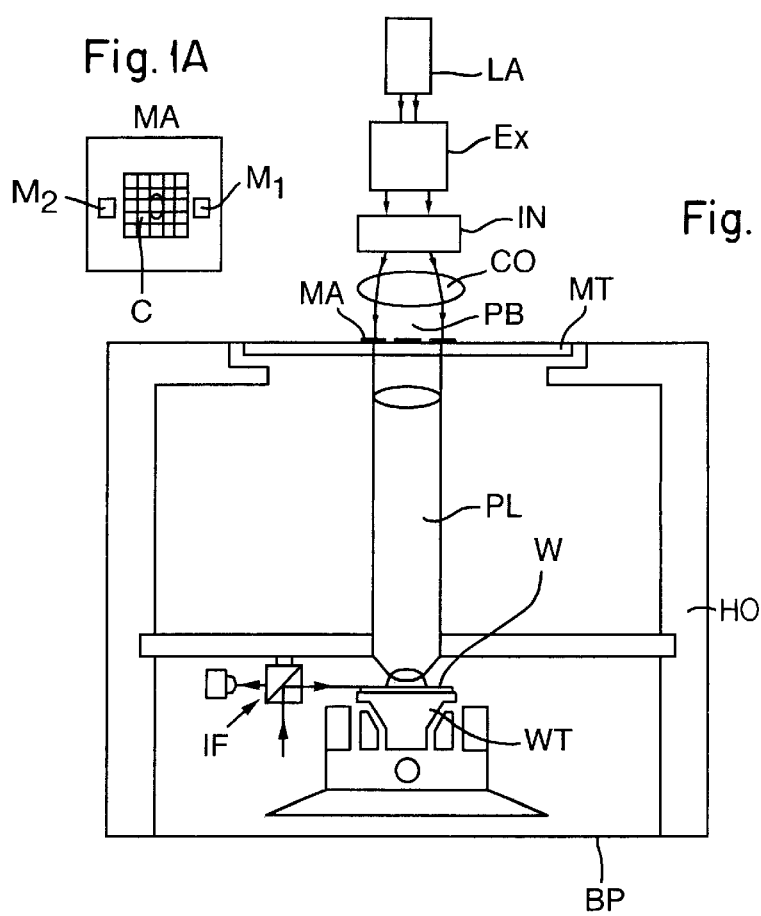
Fig. 1A
Fig. 1
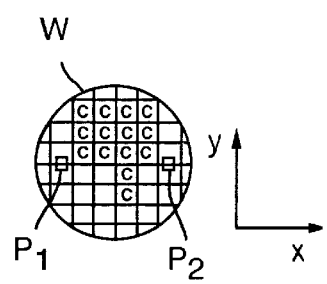
Fig. 1B
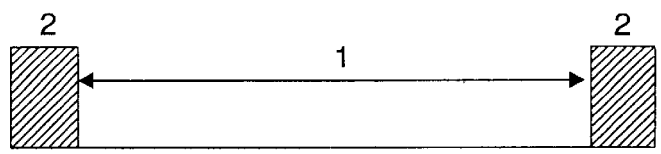
Fig. 2A
Fig. 2B
Fig. 2C
Fig. 2D
Fig. 2E
Fig. 2F
Fig. 2G

LITHOGRAPHY APPARATUS HAVING A DYNAMICALLY VARIABLE ILLUMINATION BEAM

BACKGROUND OF THE INVENTION

1. Field of the Invention

The present invention relates to a manner of control of the illumination system in a lithographic apparatus.

2. Discussion of Related Art

For the sake of simplicity, the projection system may hereinafter be referred to as the "lens"; however, this term should be broadly interpreted as encompassing various types of projection system, including refractive optics, reflective optics, catadioptric systems, and charged particle optics, for example. The illumination system may also include elements operating according to any of these principles for directing, shaping or controlling the projection beam of radiation, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more stages while one or more other stages are being used for exposures. Twin stage lithographic apparatuses are described in International Patent Applications WO 98/28665 and WO 98/40791, for example.

Lithographic projection apparatuses can be used, for example, in the manufacture of integrated circuits (ICs). In such a case, the mask (reticle) may contain a circuit pattern corresponding to an individual layer of the IC, and this pattern can be imaged onto a target area (die) on a substrate (silicon wafer) which has been coated with a layer of photosensitive material (resist). In general, a single wafer will contain a whole network of adjacent dies which are successively irradiated via the reticle, one at a time. In one type of lithographic projection apparatus, each die is irradiated by exposing the entire reticle pattern onto the die in one go; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally <1), the speed v at which the wafer table is scanned will be a factor M times that at which the reticle table is scanned. More information with regard to lithographic devices as here described can be gleaned from International Patent Application WO 97/33205.

In a lithographic apparatus, the size of features that can be imaged onto the wafer is limited by the wavelength of the projection radiation. To produce integrated circuits with a higher density of devices and hence higher operating speeds, it is desirable to be able to image smaller features. Whilst most current lithographic projection apparatus employ ultraviolet light generated by mercury lamps or excimer lasers, it has been proposed to use higher frequency (energy) radiation, e.g. EUV or X-rays, or particle beams, e.g. electrons or ions, as the illumination radiation in lithographic apparatuses.

However, the glass or quartz plates on which a conventional reticle pattern is defined are generally not transparent to some of these forms of illumination radiation. As an alternative in the case of charged-particle lithography, for example, the reticle is formed of a material, e.g. metal, that is opaque to the form of radiation used and in which apertures are cut to define the reticle pattern. To avoid the need to provide obscuring support arms to opaque islands in the pattern, the reticle pattern is divided into a plurality of sub-patterns separated by supporting struts. The complete pattern is correctly imaged on the wafer by introducing successive shifts in the illumination beam after it has passed through each sub-pattern. This type of arrangement is sometimes referred to as a "strutted mask" and an example is disclosed in U.S. Pat. No. 5,079,112.

General information with regard to the use of electron beams in lithography can be gleaned, for example, from U.S. Pat. No. 5,260,151.

The image quality of lithography systems using strutted masks can be reduced by distortion of the masks due to heating and, in charged particle apparatuses, by the presence of randomly scattered particles.

SUMMARY OF THE INVENTION

An object of the present invention is to avoid or reduce the effect of such factors on the image quality of lithographic projection apparatus.

The invention relates to the control of the illumination system in a lithographic projection apparatus that has a radiation system having a radiation source and an illumination system for supplying a projection beam of radiation; a first movable object table provided with a mask holder for holding a mask; a second movable object table provided with a substrate holder for holding a substrate; and a projection system for imaging an irradiated portion of the mask onto a target portion of the substrate.

According to the present invention there is provided a lithographic projection apparatus for scan-imaging of a mask pattern in a mask onto a substrate provided with a radiation sensitive layer, the mask having at least one transmissive region bounded at least in the scan direction by opaque regions. The apparatus include a radiation system comprising a radiation source and an illumination system for generating an illumination beam and controlling said illumination beam to scan said transmissive region between said opaque regions; a first movable object table provided with a mask holder for holding a mask; a second movable object table provided with a substrate holder for holding a substrate; and a projection system for imaging an irradiated portion of the mask onto a target portion of the substrate: The illumination system is embodied to begin a scan by generating a relatively narrow beam adjacent one of said opaque regions, to increase the width of the beam whilst it remains adjacent the opaque region, and to scan the beam towards the other of the opaque regions, thereby to provide a substantially uniform exposure on the substrate.

The term "transmissive region" is intended to refer to a region of the mask which is at least substantially transparent to the illumination radiation used.

With the present invention it is possible to avoid problems that occur when the illumination beam impinges on an opaque region (strut or skirt)-e.g. distortion of the reticle caused by excessive heating and scattering of particles—whilst at the same time ensuring that a correct exposure (dose) is given at the extremities of each transmissive region (sub-field).

The present invention provides a further advantage in that it is possible to scan the lengths of elongate sub-fields "electronically" and to scan between sub-fields "mechanically", as will be explained in greater detail in the embodiments below.

According to a yet further aspect of the invention there is provided a method of manufacturing a device using a lithographic projection apparatus having a radiation system comprising a radiation source and an illumination system for generating an illumination beam; a first object table provided with a mask holder for holding a mask; a second object table provided with a substrate holder for holding a substrate; and a projection system for imaging an irradiated portion of the mask onto a target portion of the substrate provided with a radiation sensitive layer. The method scan-imaging a mask pattern in the mask onto the target portion of the substrate, the mask having at least one transmissive region bounded at least in the scan direction by opaque regions. The imaging step includes at the beginning of a scan, generating a relatively narrow beam adjacent one of said opaque regions, increasing the width of said beam whilst it remains adjacent said opaque region, and scanning said beam towards the other of said opaque regions, thereby to provide a substantially uniform exposure on the substrate.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

In the present document, the terms illumination radiation and illumination beam are used to encompass all types of electromagnetic radiation or particle flux, including, but not limited to, ultraviolet radiation, EUV, X-rays, electrons and ions.

BRIEF DESCRIPTION OF THE DRAWINGS

The present invention will be described below with reference to exemplary embodiments and the accompanying drawings, in which:

FIG. 1 depicts a lithographic projection apparatus according to a first embodiment of the invention;

FIG. 1A illustrates view of the mask used in the embodiment of the invention depicted in FIG. 1.

FIG. 1B illustrates an enlarged view of the substrate used in the embodiment of the invention depicted in FIG. 1.

FIGS. 2A to 2G illustrate an illumination scanning particle beam profile of the present invention;

In the drawings, like reference numerals indicate like parts.

DETAILED DESCRIPTION OF THE PREFERRED EMBODIMENTS

Embodiment 1

Figure 3:
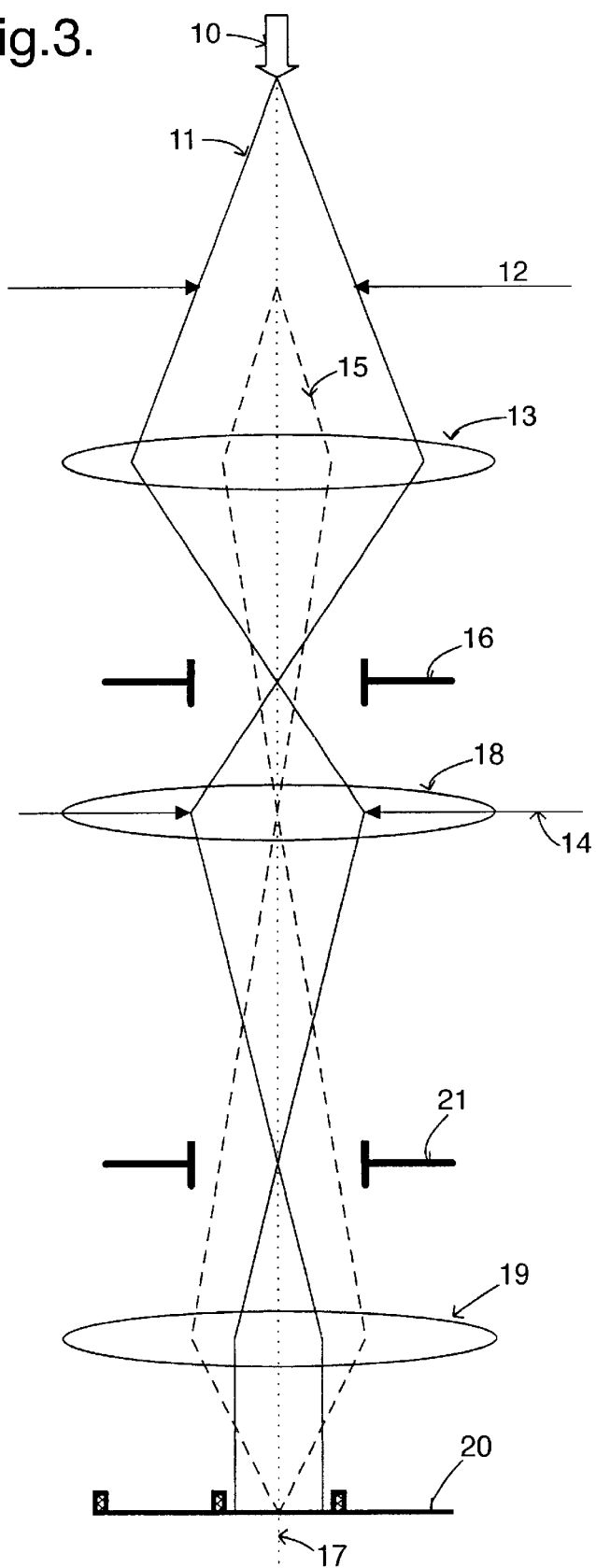
FIGS. 3 to 5 are schematic diagrams of an illumination system according to the present invention with different deflectors active.

FIG. 1 schematically depicts a lithographic projection apparatus according to the invention. The apparatus comprises:

a radiation system LA, Ex, IN, CO for supplying a projection beam PB of radiation (e.g. UV or EUV radiation);

a first object table (mask table) MT provided with a mask holder for holding a mask MA (e.g. a reticle, see FIG. 1A), and connected to first positioning means for accurately positioning the mask with respect to item PL;

a second object table (substrate table) WT provided with a substrate holder for holding a substrate W (e.g. a resist-coated silicon wafer, see FIG. 1B), and connected to second positioning means for accurately positioning the substrate with respect to item PL;

a projection system ("lens") PL (e.g. a refractive or catadioptric system, a mirror group or an array of field deflectors) for imaging an irradiated portion of the mask MA onto a target portion C (die) of the substrate W.

As here depicted, the apparatus is of a transmissive type (i.e. has a transmissive mask). However, in general, it may also be of a reflective type, for example.

The radiation system comprises a source LA (e.g. a Hg lamp, excimer laser, an undulator provided around the path of an electron beam in a storage ring or synchrotron, or an electron or ion beam source) which produces a beam of radiation. This beam is passed along various optical components comprised in the illumination system,—e.g. beam shaping optics Ex, an integrator IN and a condenser CO—so that the resultant beam PB is substantially collimated and uniformly intense throughout its cross-section.

The beam PB subsequently intercepts the mask MA which is held in a mask holder on a mask table MT. Having passed through the mask MA, the beam PB passes through the lens PL, which focuses the beam PB onto a target area C of the substrate W. With the aid of the interferometric displacement and measuring means IF, the substrate table WT can be moved accurately, e.g. so as to position different target areas C in the path of the beam PB. Similarly, the first positioning means can be used to accurately position the mask MA with respect to the path of the beam PB, e.g. after mechanical retrieval of the mask MA from a mask library. In general, movement of the object tables MT, WT will be realized with the aid of a long stroke module (course positioning) and a short stroke module (fine positioning), which are not explicitly depicted in FIG. 1. The depicted apparatus can be used in two different modes:

In step mode, the mask table MT is kept essentially stationary, and an entire mask image is projected in one go (i.e. a single "flash") onto a target area C. The substrate table WT is then shifted in the x and/or y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the x direction) with a speed $\upsilon$, so that the projection beam PB is caused to scan over a mask image; concurrently, the substrate table WT is simultaneously moved in the same or opposite direction at a speed V=M$\upsilon$, in which M is the magnification of the lens PL (typically, M=¼ or ⅕). In this manner, a relatively large target area C can be exposed, without having to compromise on resolution.

FIG. 2 illustrates the principle of the scanning illumination method of the present invention. As shown in FIG. 2A, which is a longitudinal cross-section of a mask sub-field (sub-pattern), a sub-field 1 is bounded at each end by struts 2 (the term "strut" as here employed should be construed as referring to any opaque region of the mask). FIGS. 2B to 2F show the beam width along the length of the sub-field. The beam is initially relatively narrow (FIG. 2B) and grows (FIGS. 2C & 2D) in the scan direction 4 to reach its final width (FIG. 2E). As shown in FIG. 2F, the beam is then moved to scan the length of the sub-field, whilst maintaining its width. At the end of the sub-field, the process is reversed (not shown). According to the invention, the rate of growth (and decline) of the beam width and the beam intensity (current) are controlled to ensure that the exposure (dose) is constant along the length of the sub-field, as graphically shown in FIG. 2G.

In some embodiments, the beam profile parallel to the scan direction may be trapezoidal rather than stepped. In this case, the present invention can be applied to give a total dose at the substrate which is also trapezoidal but with sloped portions much narrower than the beam width, which is acceptable.

If a charged particle beam is used then, during the beam growth and reduction stages at the beginning and end of each sub-field, the projection system can dynamically compensate for the effect of the changing space charge as the beam current changes.

If a sub-field is "electronically" scanned (i.e. the position of the beam is moved using adjustment of the optics) across its width as opposed to along its length, the invention can be used to achieve the same effects as described above. The control of beam width can be combined with beam-shaping control used to stitch sub-fields together.

A practical implementation of the invention is illustrated schematically in FIG. 3. The source (or an image of the source) 10 emits an illumination beam 11 whose width is initially controlled by first shaping aperture 12. First shaping aperture 12 generates a rectangular (or square) beam. First condenser lens 13 projects a real image of the first shaping aperture 12 onto the plane of the second shaping aperture 14, as indicated by dashed lines 15. The aperture defined by the second shaping aperture 14 is also rectangular or square. The first condenser lens 13 is also embodied to project an image onto the pivot point of shaping deflector(s) 16 which controllably shifts the image of the first shaping aperture 12 relative to the second shaping aperture 14 whilst maintaining the beam cross-over (source image) on the optical axis 17.

Second condenser lens 18 focuses the next beam cross-over into the focal plane of the third condenser lens 19 which images the shaped beam onto the reticle 20. Alignment deflectors 21 are provided in the focal plane of the third condenser lens 19 and control the position of the beam on the reticle.

Figure 4:
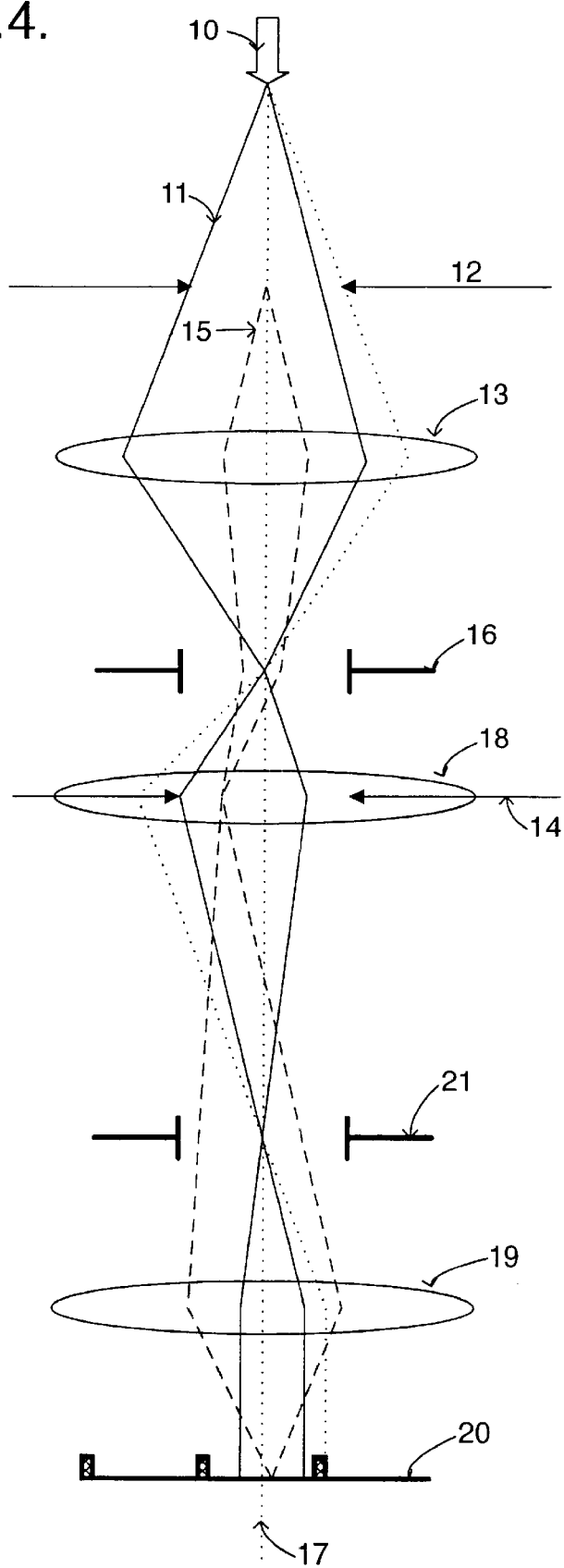

FIG. 4 shows how the shaping deflectors 16 control the beam width. When appropriately energized, the image of the first shaping aperture 12 is shifted so that it no longer coincides with the second shaping aperture 14. Thus part of the beam is blocked and the beam imaged on the reticle 20 is narrowed. At the same time the beam center is shifted, in this case to the right.

Figure 5:
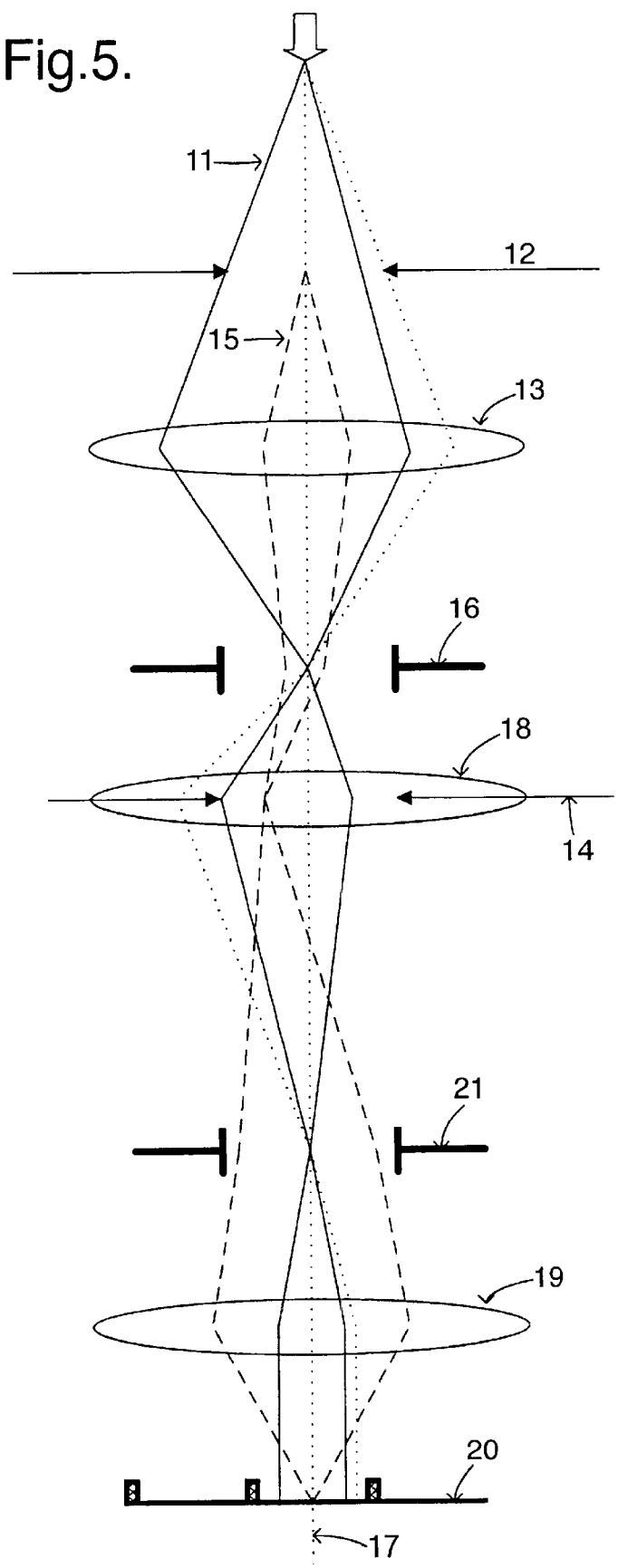

FIG. 5 shows how the alignment deflectors 21 can be used to bring the beam center back onto optical axis 17: the beam is bent at the pivot point in the same manner as with the shaping deflectors. The shaping deflectors 16 and alignment deflectors 21 can thus be used to control the beam width and position at the reticle 20.

It should be noted that FIGS. 3 to 5 omit the source optics and alignment mechanism and show the shaping and alignment deflectors in simplified form. Also, the total beam flux (current) can be controlled by moving the pivot point between the shaping apertures, by introducing an additional condenser lens, or by adjusting the source parameters. The projection system which projects an image of the reticle 20 onto the wafer is also omitted.

The components of the illumination system have been described above in functional terms. Their actual physical embodiment will depend on the nature of the illumination beam. In a preferred embodiment of the invention, the illumination beam is an electron beam. In that case the source 10 comprises an electron gun and condenser optics, and the condenser lenses 13, 18 and 19, and deflectors 16 and 21, will comprise appropriate electric and/or magnetic field generators. The shaping apertures will comprise conductive plates. Appropriate components are known from shaped-beam electron beam writers, for example.

If the illumination beam is an ion beam, or other charged particle beam, field polarities and strengths will need to be changed appropriately. For an electromagnetic, e.g. ultraviolet or X-ray, beam, appropriate refractive or glancing incidence reflective components can be used.

Embodiment 2

Figure 6:
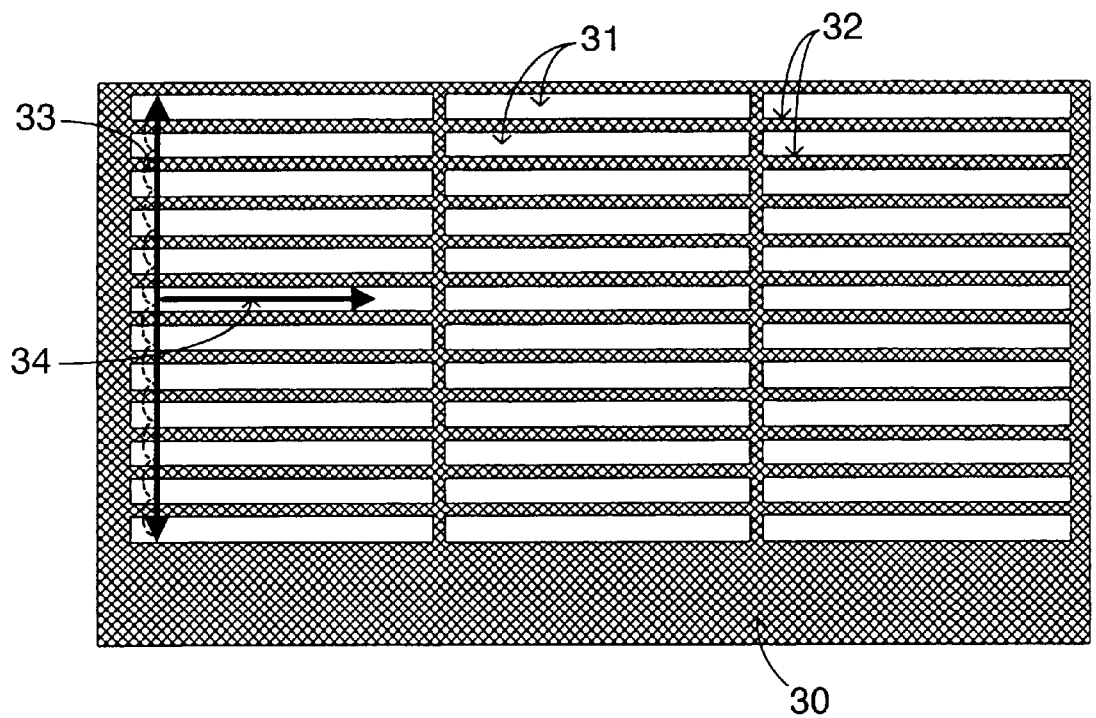
FIGS. 6 and 7 are schematic diagrams of part of a reticle showing scanning arrangements usable with the present invention.

FIG. 6 shows a portion of a strutted reticle and the scanning directions that may be used in embodiments of the invention.

As shown, the reticle 30 comprises an array of elongate sub-fields 31 (e.g. of length 12 mm) separated by struts 32. The reticle is illuminated by, e.g., a square beam of 1×1 mm² size. The beam must illuminate each sub-field for a sufficient period to deliver a dose to expose the resist on the substrate wafer. By way of an example, if the resist sensitivity is 10 $\mu C/cm^2$, the beam current 10 $\mu A$ and the magnification ¼ then the time required to expose each (sub-) field is 625 $\mu s$.

The scanning scheme adopted in the prior art is to scan across the widths of the twelve fields in the direction of arrow 33, stepping across the struts to avoid excessive heating, and then to mechanically scan the wafer and reticle along the lengths of the subfields, in the direction of arrow 34.

These schemes may be modified by scanning in direction 33 at a high frequency while keeping the scan in the direction of arrow 34 at the same speed. This is advantageous in that the illumination at the wafer then appears to come from a 0.25×3.0 mm² (after demagnification at M=¼) stripe rather than a 0.25×0.25 mm² square. This reduces the localized heating of the wafer.

Figure 7:
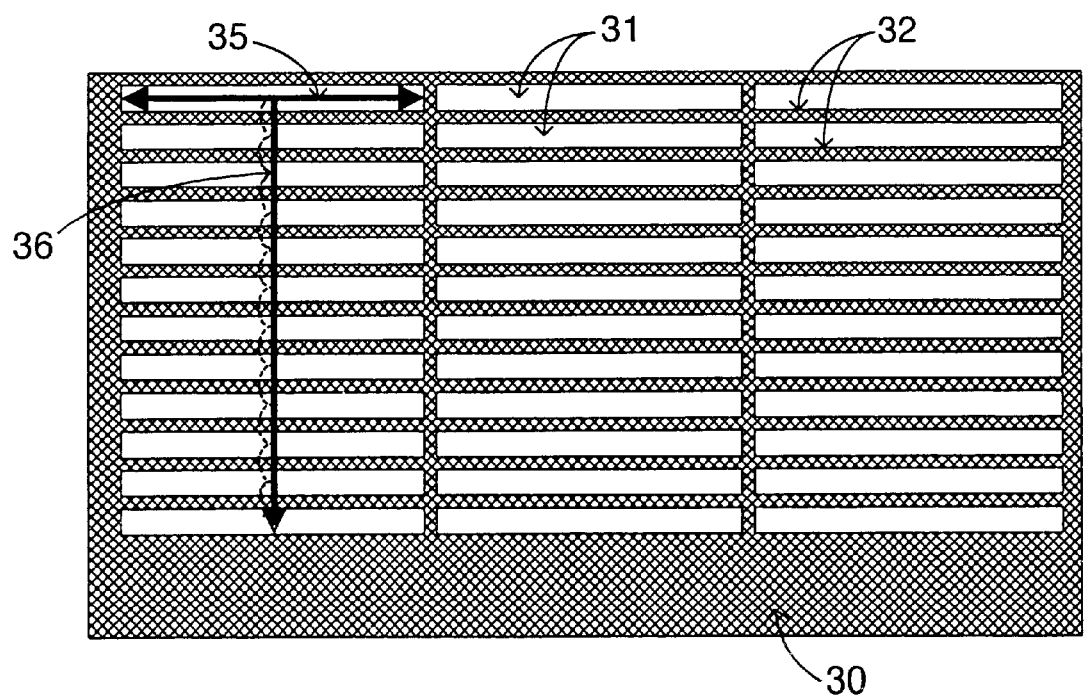

An alternative scanning scheme that the present invention makes possible is illustrated in FIG. 7. The reticle 30 is the same as that shown in FIG. 6. In the alternative scanning scheme of the present invention, the beam position is electronically controlled to scan the length of each sub-field 31 in the direction of arrow 35. Then, the reticle and wafer are (electronically and) mechanically stepped to the next sub-field as shown by arrow 36. The electronic scan frequency can be high so that each sub-field is scanned repeatedly before the reticle and wafer are stepped to the next subfield. Again, this is advantageous with regard to wafer heating.

The scanning scheme described in the previous paragraph is advantageous in that it reduces the number of stitching operations required to piece together the full image. A stitching process is described in U.S. Pat. No. 5,260,151, and involves a pair of deflectors downstream of the mask arranged to deflect off-axis beams so that the shadow that would have been caused by a strut is eliminated. With the scanning scheme of FIG. 7, only twelve horizontal stitches are required for each scan in direction 36. In the previous scheme, the number of stitches equals the number of passes times the number of fields plus eleven times the number of passes for horizontal illumination stitches. Thus, the number of stitches rises rapidly with the frequency of the electronic scan.

Embodiment 3

Figure 8A:
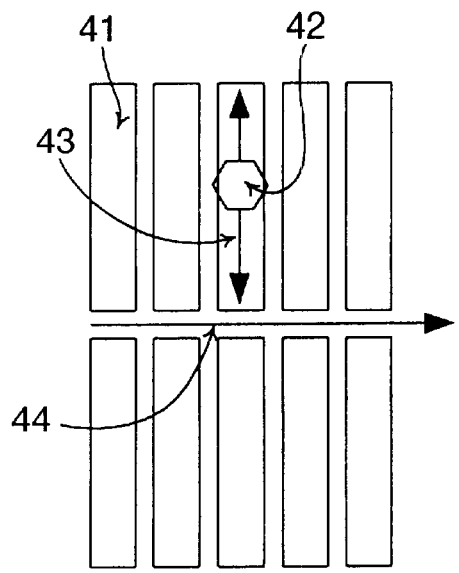
FIGS. 8A and 8B are schematic diagrams of part of a substrate showing an alternative beam shape and scanning scheme usable with the invention.
Figure 8B:
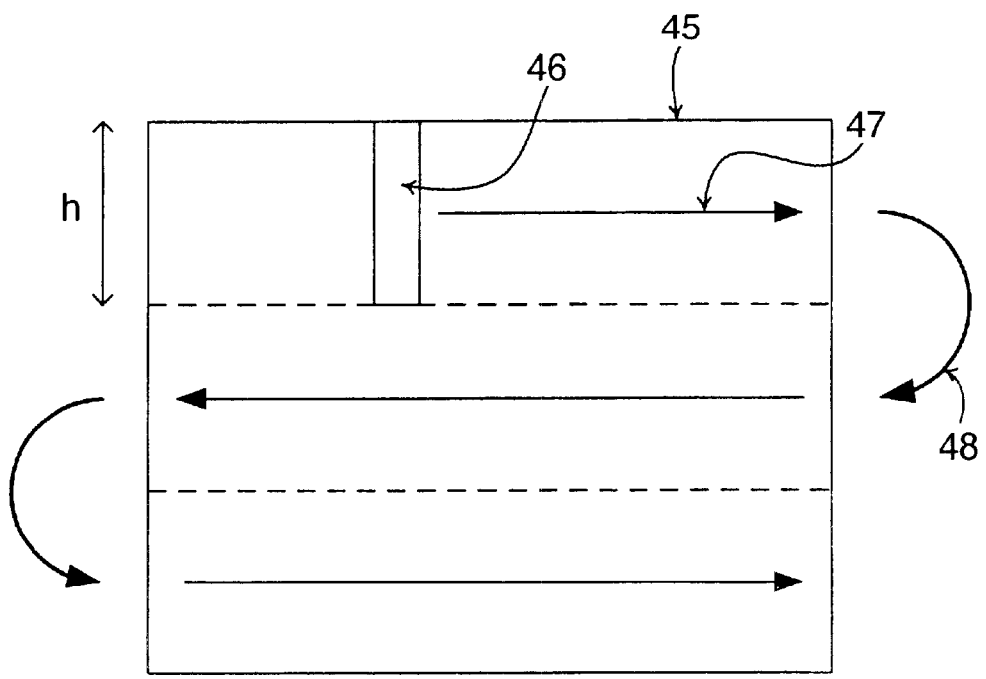

FIGS. 8A and 8B illustrate an alternative beam shape and scanning scheme that may be used with the present invention.

FIG. 8A illustrates a part of a strutted mask which includes several rows (only two shown) of elongate sub-fields 41 which are projected onto a die 45 on the substrate. The illumination beam 42, which may be hexagonal in shape, is electronically scanned along the length of a sub-field 41, as indicated by arrows 43. At the beginning of the scan, the width of the beam is in a reduced state in the direction parallel to the scan direction (arrows 43) only. As in the other embodiments of the invention, the beam is expanded to its normal width whilst adjacent to one end of the sub-field, before being scanned to the other end of the sub-field, where the process is reversed.

As shown in FIG. 8B, the electronic scan of the mask sub-field 41 prints an effective field 46 in the die 45 on the substrate. The mask and substrate are then mechanically scanned in the direction of arrows 44, 47 to print the adjacent sub-field. At the end of a row of sub-fields, the mask and substrate are stepped in the direction perpendicular to the mechanical scan 44, 47 and the mechanical scan direction is reversed, as indicated by arrow 48 to print the next row of sub-fields. This method, whereby within one die the mask and substrate are scanned and then stepped, may be referred to as "Scan and Step" in distinction to "Step and Scan" techniques in which the mask and substrate are mechanically stepped between sub-fields and are mechanically scanned. The "Scan and Step" method enables a die of 25×25 mm² to be built up using an effective beam size, at substrate level, of 0.25×0.25 mm², for example.

Whilst we have described above specific embodiments of the invention it will be appreciated that the invention may be practiced otherwise than described. The description is not intended to limit the invention.

What is claimed is:

1. A lithographic projection apparatus constructed and arranged to scan-image a mask pattern in a mask onto a substrate with a radiation sensitive layer, the mask having at least one transmissive region bounded at least in the scan direction by opaque regions, the lithographic projection apparatus comprising:

a radiation system comprising a radiation source and an illumination system, said radiation system generating an illumination beam and controlling said illumination beam to scan said transmissive region between said opaque regions, said illumination beam comprising charged particles;

a first movable object table provided with a mask holder constructed and arranged to hold a mask;

a second movable object table provided with a substrate holder constructed and arranged to hold a substrate; and a projection system constructed and arranged to image an irradiated portion of the mask onto a target portion of the substrate;

wherein said illumination system is embodied to begin a scan by generating a relatively narrow beam adjacent one of said opaque regions, to increase the width of said beam whilst it remains adjacent said opaque region, and to scan said beam towards the other of said opaque regions, thereby to provide a substantially uniform exposure on the substrate.

2. An apparatus according to claim 1, wherein said illumination system is embodied at the end of the scan, when said beam approaches said other opaque region, to reduce the width of said beam whilst said beam is adjacent said other opaque region.

3. An apparatus according to claim 1, wherein said illumination system is embodied substantially to avoid illuminating said opaque regions.

4. An apparatus according to claim 1, wherein said illumination system is embodied such that the change n the width of said beam is performed substantially linearly at a rate equal to a speed at which said transmissive region is scanned.

5. An apparatus according to claim 1, wherein said mask comprises a reticle divided into a plurality of elongate sub-fields separated by struts, said transmissive region comprising said sub-fields and said opaque regions comprising said struts.

6. An apparatus according to claim 5, wherein said illumination system is embodied to scan along the length of said sub-fields and said apparatus further comprises a transverse scanning unit constructed and arranged to scan said mask and said substrate perpendicularly to said sub-fields.

7. An apparatus according to claim 6, wherein said illumination system is embodied to scan the length of a sub-field a plurality of times between operations of said transverse scanning unit.

8. An apparatus according to claim 1, wherein said illumination system comprises first and second shaping apertures and a first deflection unit constructed and arranged to displace said image of said first shaping aperture, thereby controlling the width of said illumination beam.

9. An apparatus according to claim 8, wherein said illumination system further comprises a second deflection unit constructed and arranged to displace said illumination beam on said mask.

10. An apparatus according to claim 8, wherein said illumination system further comprises a first focusing unit constructed and arranged to project an image of said first shaping aperture onto the plane of said second shaping aperture.

11. An apparatus according to claim 1, wherein the projection system includes a projection focusing unit controlled in accordance with the width of or current in said projection beam.

12. An apparatus according to claim 1, wherein said illumination beam has a hexagonal cross-section at the mask, and said illumination system is embodied to vary the width of said illumination beam parallel to said scan direction.

13. A method of manufacturing a device using a lithographic projection apparatus comprising:
- a radiation system comprising a radiation source and an illumination system, said radiation system generating an illumination beam, said illumination beam comprising charged particles;
- a first object table provided with a mask holder constructed and arranged to hold a mask;
- a second object table provided with a substrate holder constructed and arranged to hold a substrate; and
- a projection system constructed and arranged to image an irradiated portion of the mask onto a target portion of the substrate provided with a radiation sensitive layer;

the method comprising:
- scan-imaging a mask pattern in said mask onto said target portion of said substrate, the having at least one transmissive region bounded at least in the scan direction by opaque regions,
- wherein said imaging comprises:
  - at the beginning of a scan, generating a relatively narrow beam adjacent one of said opaque regions, increasing the width of said beam while it remains adjacent said opaque region, and scanning said beam towards the other of said opaque regions, thereby to provide a substantially uniform exposure on the substrate.

14. A device manufactured using a lithographic projection apparatus comprising:
- a radiation system comprising a radiation source and an illumination system, said radiation system generating an illumination beam comprising charged particles;
- a first object table provided with a mask holder constructed and arranged to hold a mask;
- a second object table provided with a substrate holder constructed and arranged to hold a substrate; and
- a projection system constructed and arranged to image an irradiated portion of the mask onto a target portion of the substrate provided with a radiation sensitive layer;

the method comprising:
- scan-imaging a mask pattern in said mask onto said target portion of said substrate, the mask having at least one transmissive region bounded at least in a scan direction by opaque regions,
- wherein said imaging comprises at the beginning of a scan, generating a relatively narrow beam adjacent one of said opaque regions, increasing a width of said beam whilst it remains adjacent said opaque region, and scanning said beam towards the other of said opaque regions, thereby to provide a substantially uniform exposure on the substrate.

* * * * *